(12) United States Patent
Park et al.

(10) Patent No.: US 8,415,709 B2
(45) Date of Patent: Apr. 9, 2013

(54) ORGANIC LIGHT-EMITTING DISPLAY DEVICE

(75) Inventors: Jong-Hyun Park, Yongin (KR); Chun-Gi Yoo, Yongin (KR); Sun Park, Yongin (KR); Yul-Kyu Lee, Yongin (KR); Dae-Woo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/181,637

(22) Filed: Jul. 13, 2011

(65) Prior Publication Data

US 2012/0205673 A1    Aug. 16, 2012

(30) Foreign Application Priority Data

Feb. 10, 2011 (KR) .................. 10-2011-0011910

(51) Int. Cl.
*H01L 33/00* (2010.01)
(52) U.S. Cl. .................. 257/103; 257/40; 257/E33.074
(58) Field of Classification Search ............ 257/40, 257/103, E33.074
See application file for complete search history.

(56) References Cited

U.S. PATENT DOCUMENTS

| | | | |
|---|---|---|---|
| 7,202,495 B2 * | 4/2007 | Unno | 257/40 |
| 7,259,391 B2 * | 8/2007 | Liu et al. | 257/40 |
| 2010/0060148 A1 * | 3/2010 | Hwang et al. | 313/504 |
| 2010/0320453 A1 | 12/2010 | Tanaka et al. | |
| 2011/0266542 A1 * | 11/2011 | Ryu et al. | 257/57 |
| 2012/0097965 A1 * | 4/2012 | Shin et al. | 257/72 |
| 2012/0097987 A1 * | 4/2012 | Ryu et al. | 257/88 |
| 2012/0112225 A1 * | 5/2012 | Le Bellac et al. | 257/98 |
| 2012/0126258 A1 * | 5/2012 | Lee et al. | 257/88 |

FOREIGN PATENT DOCUMENTS

| | | |
|---|---|---|
| KR | 10-0685426 | 2/2007 |
| KR | 10-0953657 | 4/2010 |

* cited by examiner

*Primary Examiner* — Ngan Ngo
(74) *Attorney, Agent, or Firm* — Robert E. Bushnell, Esq.

(57) ABSTRACT

An organic light-emitting display device. The organic light-emitting display device includes a substrate, a semiconductor layer arranged on the substrate, an insulating film arranged on the semiconductor layer and a conductive layer arranged on the insulating film, wherein the semiconductor layer comprises a plurality of protrusion lines extending in a first direction, the protrusion lines being parallel to a peripheral edge of the conductive layer.

25 Claims, 3 Drawing Sheets

ORGANIC LIGHT-EMITTING DISPLAY DEVICE

CLAIM OF PRIORITY

This application makes reference to, incorporates the same herein, and claims all benefits accruing under 35 U.S.§119 from an application for ORGANIC LIGHT EMITTING DISPLAY DEVICE earlier filed in the Korean Intellectual Property Office on 10 Feb. 2011 and there duly assigned Korean Patent Application No. 10-2011-0011910.

BACKGROUND OF THE INVENTION

1. Field of the Invention

The present invention relates to an organic light-emitting display device in which a plurality of protrusion lines is formed on a semiconductor layer.

2. Description of the Related Art

The rapid development of the information and technology (IT) industry is dramatically increasing the use of display devices. Recently, there have been demands for display devices that are lightweight and thin, consume low power and provide high resolution. To meet these demands, liquid crystal displays or organic light-emitting displays using organic light-emitting characteristics are being developed.

Organic light-emitting displays, which are next-generation display devices having self light-emitting characteristics, have better characteristics than liquid crystal displays in terms of viewing angle, contrast, response speed and power consumption, and can be manufactured to be thin and lightweight since a backlight is not required.

An organic light-emitting display includes a substrate having a pixel region and a non-pixel region and a container or another substrate which is placed to face the substrate for encapsulation and attached to the substrate by a sealant such as epoxy. Within the pixel region of the substrate are pixels which represent a plurality of organic light-emitting devices connected in a matrix pattern between scan lines and data lines. Within the non-pixel region of the substrate are the scan lines and the data lines extending from the scan lines and the data lines of the pixel region, power source supply lines for operating the organic light-emitting devices and a scan driver and a data driver for processing signals received from an external source via input pads and providing the processed signals to the scan lines and the data lines.

SUMMARY OF THE INVENTION

When a semiconductor layer is formed using a crystallization process, a short circuit may occur between upper and lower electrodes of a capacitor, thereby causing dark spot defects.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display device including a substrate, a semiconductor layer arranged on the substrate, an insulating film arranged on the semiconductor layer and a conductive layer arranged on the insulating film, wherein the semiconductor layer comprises a plurality of protrusion lines extending in a first direction, the protrusion lines being parallel to a peripheral edge of the conductive layer. The organic light-emitting display device may also include a wiring electrically connected to the semiconductor layer. The organic light-emitting display device may also include a wiring having a main portion that extends in a second direction, the wiring being in contact with and being electrically connected to an extension portion of the semiconductor layer. The wiring may include an extension portion that protrudes in the first direction from the main portion, the extension portion of the wiring may be electrically connected to the extension portion of the semiconductor layer by at least one contact.

The substrate may include a capacitor region, a portion of the semiconductor layer may be arranged within the capacitor region. The conductive layer may be a transparent electrode. Each of the protrusion lines may include a plurality of protrusions, and the protrusions are arranged in a row along the first direction. The wiring and the conductive layer may be spaced-apart from each other by a space and may not overlap each other, and at least one of the protrusion lines may be arranged within the space between the wiring and the conductive layer. A direction in which the extension portion of the wiring protrudes may be parallel to a direction in which the protrusion lines extend. At least one of the protrusion lines may not overlapped by either the conductive layer or the wiring and may extend parallel to an adjacent peripheral edge of the conductive layer.

The organic light-emitting display device may also include a wiring having a main portion that extends in a second direction, the wiring may be electrically connected to the semiconductor layer, wherein the first direction forms an oblique angle with respect to the second direction. The wiring may also include an extension portion that protrudes perpendicularly from the main portion of the wiring, the extension portion may overlap the semiconductor layer. The conductive layer may not overlap all of the protrusion lines, and a portion of a peripheral edge of the conductive layer that is adjacent to the wiring may extend in the first direction. At least one of the protrusion lines may not be overlapped by the conductive layer and may extend parallel an adjacent peripheral edge of the conductive layer.

According to another aspect of the present invention, there is provided an organic light-emitting display device that includes a substrate including a capacitor region, a semiconductor layer arranged on the substrate and within the capacitor region, an insulating film arranged on the semiconductor layer, a transparent electrode arranged on the insulating film of the capacitor region and a wiring electrically connected to the semiconductor layer, wherein the semiconductor layer comprises a plurality of protrusion lines extending in a first direction, a portion of the semiconductor layer being overlapped by the wiring, wherein individual ones of the protrusion lines are arranged either entirely within peripheral edges of the transparent electrode or entirely outside the peripheral edges of the transparent electrode.

The wiring may have a main portion that extends in a second direction that is perpendicular to the first direction. Each of the protrusion lines may include a plurality of protrusions, and each of the protrusion lines may extend in the first direction. The wiring may also includes an extension portion that protrudes in the first direction from the main portion of the wiring and may be electrically connected to the semiconductor layer, wherein the extension portion and the transparent electrode may be spaced-apart from each other by a space, and at least one of the protrusion lines may be arranged in the space between the extension portion and the transparent electrode. At least one of the protrusion lines may not be overlapped by either of the transparent electrode or the wiring. The at least one of the protrusion lines which is not overlapped by either the transparent electrode and the wiring may extend parallel to at least one peripheral edge of the transparent electrode.

According to another aspect of the present invention, there is provided an organic light-emitting display device that includes a substrate comprising a capacitor region, a semiconductor layer arranged on the substrate and within the capacitor region, an insulating film arranged on the semiconductor layer, a transparent electrode arranged on the insulating film and within the capacitor region and a wiring electrically connected to the semiconductor layer, wherein the semiconductor layer comprises a plurality of protrusion lines extending in a first direction, and the wiring including a main portion that extends in a second direction, wherein the first direction forms an oblique angle with respect to the second direction.

The protrusion lines of the semiconductor layer may be parallel to a peripheral edge of the transparent electrode. Each of the protrusion lines may include a plurality of protrusions, and the protrusions may be arranged in a row along the first direction. The wiring and the transparent electrode may be spaced-apart from each other by a space, and at least one of the protrusion lines may be arranged within the space between the wiring and the transparent electrode. The transparent electrode may not overlap at least one of the protrusion lines. The at least one of the protrusion lines which is not overlapped by the transparent electrode may extend parallel to an adjacent peripheral edge of the transparent electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
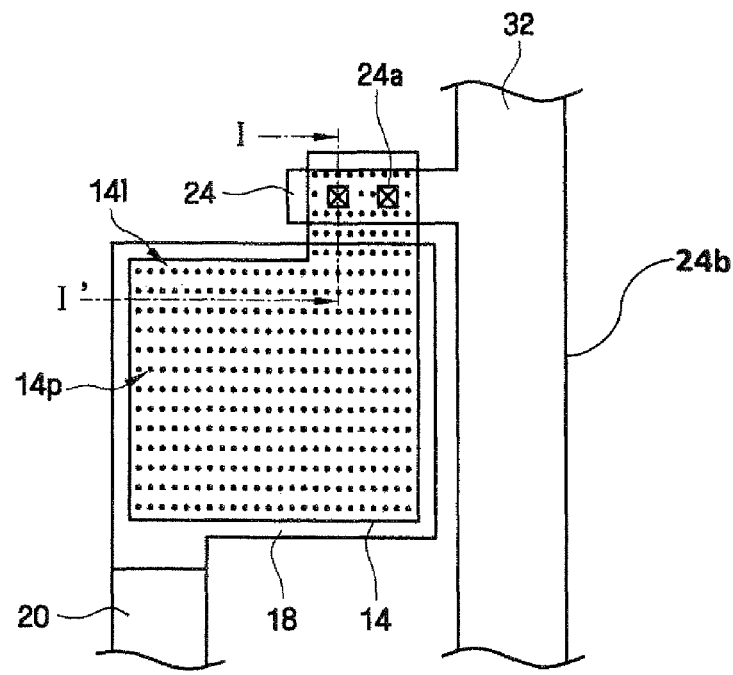
FIG. 1 is a plan view of an organic light-emitting display device according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity. Like reference numerals refer to like elements throughout the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present invention Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
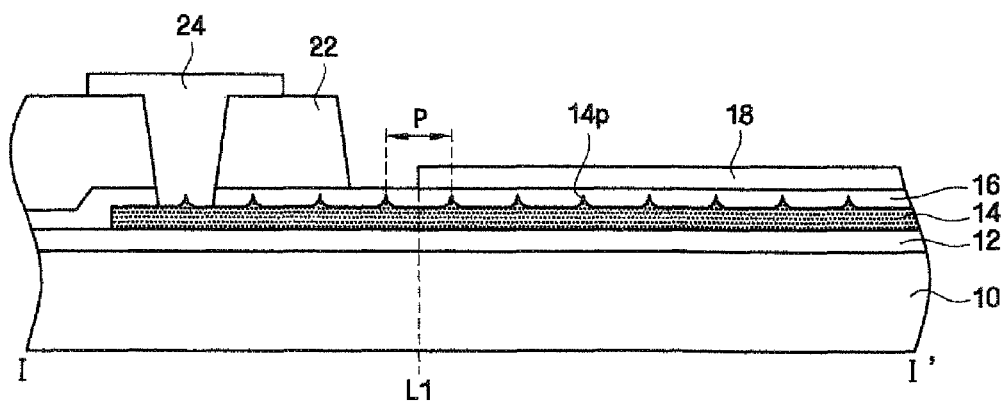
FIG. 2 is a cross-sectional view taken along the line I-I' of FIG. 1.

Hereinafter, an organic light-emitting display device according to an exemplary embodiment of the present invention will be described with reference to FIGS. 1 and 2. FIG. 1 is a plan view of an organic light-emitting display device according to an exemplary embodiment of the present invention and FIG. 2 is a cross-sectional view taken along the line I-I' of FIG. 1.

The organic light-emitting display device according to the current exemplary embodiment includes a substrate 10, a semiconductor layer 14 formed on the substrate 10, an insulating film 16 formed on the semiconductor layer 14, and a conductive layer 18 formed on the insulating film 16.

The substrate 10 may be made of a transparent glass material containing $SiO_2$ as a main component, however the material that forms the substrate 10 is not limited to the transparent glass material. The substrate 10 may instead be made of a transparent plastic material that may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

Although not shown in the drawings, the substrate 10 may include a pixel region which substantially emits light using an organic light-emitting layer formed thereon, a transistor region on which a thin-film transistor is formed, and a capacitor region which maintains a constant driving voltage. In FIGS. 1 and 2, the capacitor region is illustrated in which a driving voltage applied from an external source is maintained constant by the semiconductor layer 14 and the conductive layer 18.

In a bottom emission organic light-emitting display device in which an image is realized toward the substrate 10, the substrate 10 may be made of a transparent material. In another embodiment, in a top emission organic light-emitting display device in which an image is realized away from the substrate 10, the substrate 10 may be made of materials other than the transparent material. In this case, the substrate 10 may be made of metal. When the substrate 10 is made of metal, the substrate 10 may contain at least one material selected from the group consisting of carbon (C), iron (Fe), chrome (Cr), manganese (Mn), nickel (Ni), titanium (Ti), molybdenum (Mo), and stainless steel (SUS), however the material that forms the substrate 10 is not limited to the above materials. The substrate 10 may also be a metal foil.

A buffer layer 12 may further be formed on the substrate 10 to planarize the substrate 10 and to prevent penetration of impurities into the substrate 10. The buffer layer 12 is provided on the entire surface of the substrate 10 and may be a single layer of $SiO_x$, $SiN_x$ or $SiO_2N_x$, or a multilayer of these materials.

The semiconductor layer 14 is formed on the substrate 10 having the buffer layer 12. The semiconductor layer 14 may be made of silicon (Si), i.e., amorphous silicon (a-Si). Alternatively, the semiconductor layer 14 may be made of polycrystalline silicon (p-Si). Otherwise, the semiconductor layer 14 may be made of, but is not limited to Ge, GaP, GaAs, or AlAs.

The semiconductor layer 14 may be a silicon semiconductor layer formed by lightly diffusing n-type impurities of a silicon-on-insulator (SOI) substrate. Alternatively, the semiconductor layer 14 may be formed by doping a portion of amorphous silicon with P or N-type impurities. As shown in the drawings, the semiconductor layer 14 may be formed in each of the transistor region and the capacitor region of the substrate 10. As described above, the semiconductor layer 14 arranged within the capacitor region may become part of a capacitor together with the conductive layer 18 disposed above the semiconductor layer 14. The conductive layer 18 may be, for example, a transparent electrode. A case where the conductive layer 18 is a transparent electrode will hereinafter be described as an example, however the conductive layer 18 is not limited to a transparent electrode.

As shown in the drawings, the semiconductor layer 14 includes a plurality of lines of protrusions (hereinafter, referred to as protrusion lines 14*l*) extending in a first direction. Here, the protrusion lines 14*l* of the semiconductor layer 14 are parallel to at least one peripheral edge of the conductive layer 18. When the protrusion lines 14*l* of the semiconductor layer 14 are parallel to at least one peripheral edge of the conductive layer 18, they may be arranged along any one edge of the conductive layer 18 as shown in the plan view of FIG. 1. Alternatively, as shown in the cross-sectional view of FIG. 2, the protrusion lines 14*l* of the semiconductor layer 14 may extend parallel to a line L1 defined by a step portion of the conductive layer 18.

Each protrusion line 14*l* does not penetrate the conductive layer 18 (i.e., a transparent electrode). As shown in FIG. 1, when each protrusion line 14*l* does not penetrate the conductive layer 18, a plurality of protrusions 14*p* may be arranged in a row along a predetermined direction on a top surface of the semiconductor layer 14 disposed under the conductive layer 18, and each row of the protrusions 14*p* may form each protrusion line 14*l*. That is, the plurality of protrusions 14*p* may extend in the first direction to be parallel to each other.

When seen in the plan view, each protrusion line 14*l* extending in a predetermined direction does not pass through a peripheral edge of the conductive layer 18 (i.e., the transparent electrode). In other words, as shown in FIG. 1, the protrusion lines 14*l* are not positioned such that some of the protrusions 14*p* included in each protrusion line 14*l* are overlapped by the conductive layer 18 while the other ones of the protrusions 14*p* within a same protrusion line 14*l* are not overlapped by the conductive layer 18. Instead, the protrusion lines 14*l* are positioned such that all of the protrusions 14*p* included in each protrusion line 14*l* are either overlapped or not overlapped by the conductive layer 18.

The semiconductor layer 14 of the capacitor region should be a conductor so as to serve as an electrode plate that for the capacitor that opposes conductive layer 18 (i.e., the transparent electrode) thereabove which serves as the opposing electrode plate. Therefore, the entire region of the semiconductor layer 14 that is within the capacitor region may be doped with impurities to provide properties of a conductor.

The insulating film 16 may be formed on the semiconductor layer 14. The insulating film 16 covers the semiconductor layer 14 and insulates the semiconductor layer 14 from the conductive layer 18 thereon. The insulating film 16 may be, for example, a gate insulating film.

Like the buffer layer 12, the insulating film 16 may be a single layer of $SiO_2$, $SiN_x$ or $SiO_2N_x$, or a multilayer of these materials. The insulating film 16 may be made of the same material as the buffer layer 12 or a different material from that of the buffer layer 12.

The conductive layer 18 (i.e., the transparent electrode) may be formed on the insulating film 16. As described above, the conductive layer 18 within the capacitor region may serve as the opposing electrode plate for the capacitor and face the semiconductor layer 14 thereunder, the capacitor serving to maintain constant the driving voltage of the organic light-emitting display device according to the current exemplary embodiment.

The conductive layer 18 may be made of a transparent conductive material. The transparent conductive material may include one or more materials selected from indium tin oxide (ITO), indium zinc oxide (IZO), carbon nanotubes, a conductive polymer, and nanowires. That is, the conductive layer 18 may be made out of a mixture of one or more of the above transparent conductive materials.

The conductive layer 18 of the capacitor region may form an electrode plate of the capacitor that faces the other electrode plate which is the underlying semiconductor layer 14 that is doped to have properties of a conductor. The conductive layer 18 within the transistor region may deliver a gate driving voltage together with a gate electrode 20 thereon. The conductive layer 18 within the pixel region may form a pixel unit which is connected to source and drain electrodes of the transistor region to receive a driving voltage that causes the organic light-emitting layer to emit light.

Although not shown in the drawings, a gate electrode 20 may be formed on the conductive layer 18 and within the transistor region. The gate electrode 20 may control light emission of each pixel by transmitting a gate signal to each pixel. In addition, an interlayer insulating film 22 may be formed on the gate electrode 20. The interlayer insulating film 22 may insulate the gate electrode 20 from the source and drain electrodes. The interlayer insulating film 22 may be made of, for example, an inorganic material. Like the buffer layer 12, the interlayer insulating film 22 may be a single layer of $SiO_2$, $SiN_x$ or $SiO_2N_x$, or a multilayer of these materials.

Referring to now FIG. 1, a wiring 32 may further be provided. The wiring 32 extends in a second direction and is electrically connected to the semiconductor layer 14. In some embodiments, as shown in the drawing, the wiring 32 may include an extension portion 24 which protrudes in the first direction, and the extension portion 24 may overlap part of the semiconductor layer 14 and may be electrically connected to the semiconductor layer 14 by one or more contacts 24a.

More specifically, the wiring 32 may include a main portion 24b that extends in a direction different from the direction in which the protrusion lines 14l extend. As shown in the drawing, the wiring 32 may extend perpendicular to the protrusion lines 14l. That is, the protrusion lines 14l may extend in a horizontal direction, and the wiring 32 may extend in a vertical direction.

The wiring 32 may include the extension portion 24 which protrudes from the main portion 24b. The extension portion 24 is electrically connected to the semiconductor layer 14 by the contacts 24a and applies an external voltage received through the wiring 32 to the semiconductor layer 14.

The extension portion 24 and the conductive layer 18 (i.e., the transparent electrode) are separated (i.e., spaced-apart) from each other by a space and thus do not overlap each other. At least one of the protrusion lines 14l may be disposed in the space between the extension portion 24 and the conductive layer 18.

Here, the at least one of the protrusion lines 14l may not be overlapped by either of the conductive layer 18 or the extension portion 24. That is, the protrusions 14p that form the at least one of the protrusion lines 14l may not be overlapped by any of the conductive layer 18 or the extension portion 24. To sum up, at least one of the protrusion lines 14l may not be overlapped by either the conductive layer 18 or the wiring 32 and may extend parallel to the line L1 at the adjacent peripheral edge of the conductive layer 18 which is adjacent to the extension portion 24. That is, at least one of the protrusion lines 14l which is not overlapped by the conductive layer 18 may extend parallel to at least one peripheral edge of the conductive layer 18.

As shown in the drawings, the direction in which the extension portion 24 protrudes may be the same as the direction in which the protrusion lines 14l extend. That is, the direction in which the extension portion 24 protrudes may be parallel to the direction in which the protrusion lines 14l extend.

From a different perspective, the organic light-emitting display device according to the current exemplary embodiment may include the substrate 10 having the capacitor region, the buffer layer 12 formed on the substrate 10, the semiconductor layer 14 formed on the buffer layer 12 of the capacitor region, the insulating film 16 (i.e., the gate insulating film) formed on the semiconductor layer 14, the conductive layer 18 (i.e., the transparent electrode) formed on the insulating film 16, and the wiring 32 electrically connected to the semiconductor layer 14. The semiconductor layer 14 includes a plurality of protrusion lines 14l extending in the first direction. The wiring 32 extends in the second direction different from the first direction and includes the extension portion 24 which protrudes from the wiring 32 in the first direction and is electrically connected to the semiconductor layer 14. Here, the protrusion lines 14l may be perpendicular to the wiring 32.

In the drawings, at least one of the protrusion lines 14l is not overlapped by the conductive layer 18. However, in some other embodiments, all of the protrusion lines 14l of the semiconductor layer 14 may be overlapped by one of the conductive layer 18 or the wiring 32 (specifically, the extension portion 24).

In the organic light-emitting display device according to the current exemplary embodiment, since a plurality of protrusion lines formed on a top surface of a semiconductor layer do not cross a peripheral edge of a transparent electrode, they are not perpendicular to a peripheral edge of the transparent electrode. This structure can prevent a short circuit between an upper electrode and a lower electrode which form a capacitor in a capacitor region, that is, between the transparent electrode and the semiconductor layer.

Figure 3:
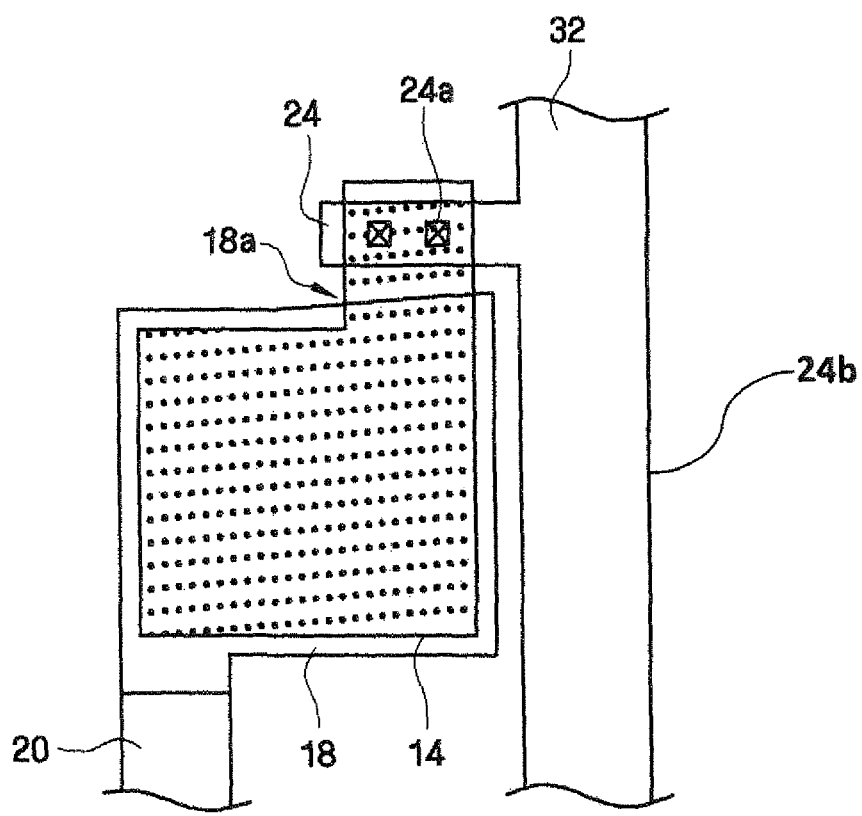
FIG. 3 is a plan view of an organic light-emitting display device according to another exemplary embodiment of the present invention.

Hereinafter, an organic light-emitting display device according to another exemplary embodiment of the present invention will be described with reference to FIG. 3. FIG. 3 is a plan view of an organic light-emitting display device according to another exemplary embodiment of the present invention.

The organic light-emitting display device according to the current exemplary embodiment is different from the organic light-emitting display device according to the previous exemplary embodiment in that a direction in which a plurality of protrusion lines extend is tilted (i.e., forms an angle) with respect to a direction in which an extension portion protrudes from a wiring. For simplicity, the following description will focus on this difference, and elements substantially identical to those of the previous embodiment are indicated by like reference numerals and thus a detailed description thereof will be omitted or simplified.

Referring to FIG. 3, the organic light-emitting display device according to the current exemplary embodiment includes a substrate 10 having a capacitor region, a buffer layer 12 formed on the substrate 10, a semiconductor layer 14 disposed on the buffer layer 12 of the capacitor region, a gate insulating film 16 formed on the semiconductor layer 14, a transparent electrode 18 formed on the gate insulating film 16 in the capacitor region, and a wiring 32 electrically connected to the semiconductor layer 14. Here, the semiconductor layer 14 includes a plurality of protrusion lines 14l extending in a first direction. The wiring 32 includes a main portion 24b that extends in a second direction different from the first direction and includes an extension portion 24 which protrudes perpendicularly from the main portion 24b of wiring 32 and is electrically connected to the semiconductor layer 14.

As shown in FIG. 3, the first direction in which the protrusion lines 14l of the semiconductor layer 14 extend may form an angle and thus be tilted with respect to the direction in which the extension portion 24 protrudes from the main portion 24b of wiring 32. When the first direction in which the protrusion lines 14l extend is tilted with respect to the direction in which the extension portion 24 protrudes from the wiring 32, the direction in which the protrusion lines 14l extend and the direction in which the extension portion 24 protrudes may not be parallel to each other but may form an acute angle. From another perspective, the protrusion lines 14l may form an oblique angle with respect to the main portion 24b of wiring 32. That is, when the protrusion lines 14l extend in the first direction and when the main portion 24b of wiring 32 extends in the second direction, the first direction of the protrusion lines 14l may be oblique with respect to the second direction of the main portion 24b of the wiring 32.

The reason why the protrusion lines 14l are tilted is that a crystallization process for forming the semiconductor layer 14 is, by its nature, sometimes performed in a tilted manner in a predetermined direction. As shown in the drawing, at least a portion of an edge of the transparent electrode 18, particularly, a portion adjacent to the extension portion 24 may also be tilted. In other words, the transparent electrode 18 may not overlap at least one of the protrusion lines 14l, and a portion of an adjoining peripheral edge of the transparent electrode 18 which is adjacent to the extension portion 24 may form an acute angle with the extension portion.

As described above, each protrusion line 14*l* may include a plurality of protrusions 14*p*, and the protrusions 14*p* may be arranged in a row along the first direction. In addition, the extension portion 24 may overlap a portion of the semiconductor layer 14 and may be electrically connected to the semiconductor layer 14 by one or more contacts 24*a*. The contacts 24*a* may be disposed on the extension portion 24.

The extension portion 24 and the transparent electrode 18 are spaced-apart from each other by a space and thus do not overlap each other. At least one of the protrusion lines 14*l* may be disposed in the space between the extension portion 24 and the transparent electrode 18. Further, as shown in the drawing, the transparent electrode 18 may not overlap at least one of the protrusion lines 14*l*, and a portion of a peripheral edge of the transparent electrode 18 which is adjacent to the extension portion 24 may be parallel to the direction in which the tilted protrusion lines 14*l* extend.

As described above, in the current exemplary embodiment, at least one of a plurality of protrusion lines is not overlapped by a transparent electrode and extends parallel to at least one peripheral edge of the transparent electrode. This structure can prevent a short circuit between electrodes that form a capacitor in a capacitor region.

Figure 4:
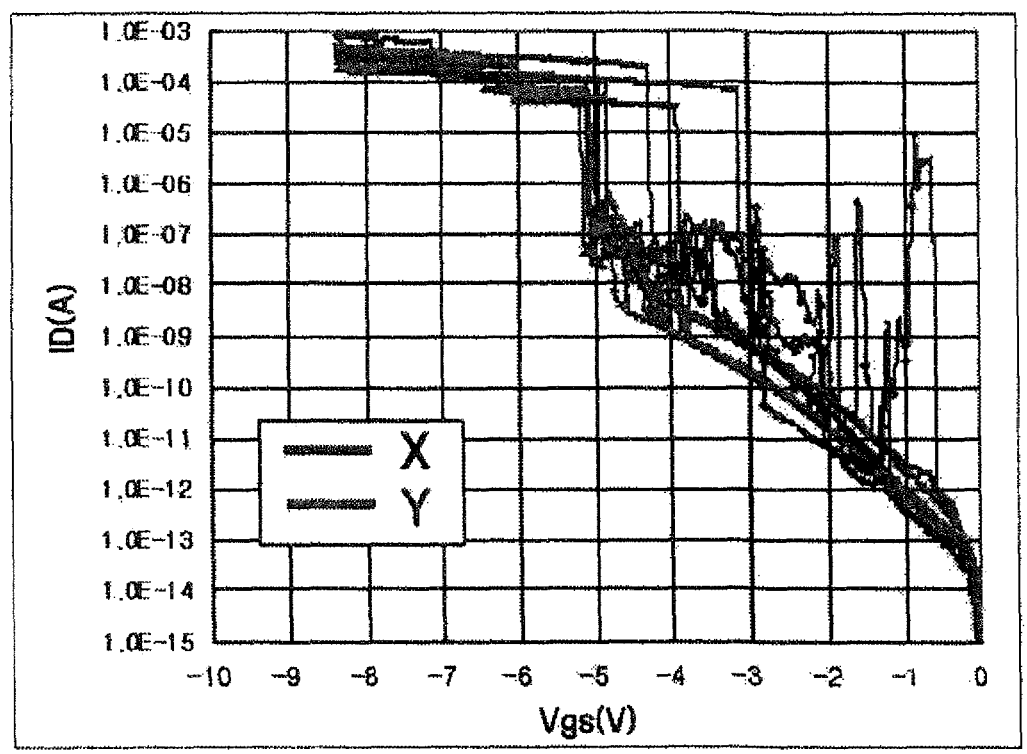
FIG. 4 is a graph illustrating effects of an organic light-emitting display device according to an exemplary embodiment of the present invention.

Effects of an organic light-emitting display device according to an exemplary embodiment of the present invention will now be described with reference to FIG. 4. FIG. 4 is a graph illustrating breakdown voltage characteristics of a capacitor of a conventional organic light-emitting display device X and that of an organic light-emitting display device Y according to an exemplary embodiment of the present invention.

Referring to FIG. 4, the horizontal axis represents the gate-source voltage Vgs, and the vertical axis represents drain current Id. As shown in the graph, the exemplary organic light-emitting display device Y in which a plurality of protrusion lines do not intersect a peripheral edge of a transparent electrode has better breakdown voltage characteristics than the conventional organic light-emitting display device which does not include an extension portion and in which a plurality of protrusion lines intersect with peripheral edges of a transparent electrode.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An organic light-emitting display device, comprising:
   a substrate;
   a semiconductor layer arranged on the substrate;
   an insulating film arranged on the semiconductor layer; and
   a conductive layer arranged on the insulating film,
   wherein the semiconductor layer comprises a plurality of protrusion lines extending in a first direction, the protrusion lines being parallel to a peripheral edge of the conductive layer, wherein at least one of the protrusion lines is not overlapped by the conductive layer and extends parallel an adjacent peripheral edge of the conductive layer.

2. The device of claim 1, further comprising a wiring electrically connected to the semiconductor layer.

3. The device of claim 1, further comprising a wiring having a main portion that extends in a second direction, the wiring being in contact with and being electrically connected to an extension portion of the semiconductor layer.

4. The device of claim 3, wherein the wiring comprises an extension portion that protrudes in the first direction from the main portion, the extension portion of the wiring being electrically connected to the extension portion of the semiconductor layer by at least one contact.

5. The device of claim 1, wherein the semiconductor layer is doped with impurities, and the insulating layer being a dielectric for the capacitor.

6. The device of claim 1, wherein the conductive layer is a transparent electrode.

7. The device of claim 1, wherein each of the protrusion lines comprises a plurality of protrusions, and the protrusions are arranged in a row along the first direction.

8. The device of claim 2, wherein the wiring and the conductive layer are spaced-apart from each other by a space and do not overlap each other, and at least one of the protrusion lines is arranged within the space between the wiring and the conductive layer.

9. The device of claim 4, wherein a direction in which the extension portion of the wiring protrudes is parallel to a direction in which the protrusion lines extend.

10. The device of claim 2, wherein at least one of the protrusion lines is not overlapped by either the conductive layer or the wiring and extends parallel to an adjacent peripheral edge of the conductive layer.

11. The device of claim 1, further comprising a wiring having a main portion that extends in a second direction, the wiring being electrically connected to the semiconductor layer, wherein the first direction forms an oblique angle with respect to the second direction.

12. The device of claim 11, wherein the wiring also includes an extension portion that protrudes perpendicularly from the main portion of the wiring, the extension portion overlaps the semiconductor layer.

13. The device of claim 11, wherein the conductive layer does not overlap all of the protrusion lines, and a portion of a peripheral edge of the conductive layer that is adjacent to the wiring extends in the first direction.

14. An organic light-emitting display device, comprising:
    a substrate comprising a capacitor region;
    a semiconductor layer arranged on the substrate and within the capacitor region;
    an insulating film arranged on the semiconductor layer;
    a transparent electrode arranged on the insulating film of the capacitor region; and
    a wiring electrically connected to the semiconductor layer, wherein the semiconductor layer comprises a plurality of protrusion lines extending in a first direction, a portion of the semiconductor layer being overlapped by the wiring, wherein individual ones of the protrusion lines are arranged either entirely within peripheral edges of the transparent electrode or entirely outside the peripheral edges of the transparent electrode, wherein the protrusion lines of the semiconductor layer are parallel to a peripheral edge of the transparent electrode.

15. The device of claim 14, the wiring having a main portion that extends in a second direction that is perpendicular to the first direction.

16. The device of claim 14, wherein each of the protrusion lines comprises a plurality of protrusions, and each of the protrusion lines extend in the first direction.

17. The device of claim 15, wherein the wiring also includes an extension portion that protrudes in the first direction from the main portion of the wiring and is electrically connected to the semiconductor layer, wherein the extension portion and the transparent electrode are spaced-apart from each other by a space, and at least one of the protrusion lines is arranged in the space between the extension portion and the transparent electrode.

18. The device of claim 14, wherein at least one of the protrusion lines is not overlapped by either of the transparent electrode or the wiring.

19. The device of claim 18, wherein the at least one of the protrusion lines which is not overlapped by either the transparent electrode and the wiring extends parallel to at least one peripheral edge of the transparent electrode.

20. An organic light-emitting display device, comprising:
a substrate comprising a capacitor region;
a semiconductor layer arranged on the substrate and within the capacitor region;
an insulating film arranged on the semiconductor layer;
a transparent electrode arranged on the insulating film and within the capacitor region; and
a wiring electrically connected to the semiconductor layer, wherein the semiconductor layer comprises a plurality of protrusion lines extending in a first direction, and the wiring including a main portion that extends in a second direction, wherein the first direction forms an oblique angle with respect to the second direction.

21. The device of claim 20, wherein each of the protrusion lines comprises a plurality of protrusions, and the protrusions are arranged in a row along the first direction.

22. The device of claim 20, wherein the wiring and the transparent electrode are spaced-apart from each other by a space, and at least one of the protrusion lines is arranged within the space between the wiring and the transparent electrode.

23. The device of claim 20, wherein the transparent electrode does not overlap at least one of the protrusion lines.

24. The device of claim 23, wherein the at least one of the protrusion lines which is not overlapped by the transparent electrode extends parallel to an adjacent peripheral edge of the transparent electrode.

25. The device of claim 14, the semiconductor layer and the transparent electrode being first and second electrode plates of a capacitor arranged within the capacitor region, the semiconductor layer being doped with impurities.

* * * * *